US006682997B1

(12) United States Patent
Lawlor

(10) Patent No.: US 6,682,997 B1
(45) Date of Patent: Jan. 27, 2004

(54) ANGLED IMPLANT IN A FABRICATION TECHNIQUE TO IMPROVE CONDUCTIVITY OF A BASE MATERIAL

(75) Inventor: Brian F. Lawlor, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 10/229,625

(22) Filed: Aug. 28, 2002

(51) Int. Cl.⁷ .................. H01L 21/3205; H01L 29/76
(52) U.S. Cl. .................. 438/587; 438/588; 438/592; 438/652; 257/388; 257/412
(58) Field of Search .................. 257/388, 751, 257/390, 412, 750–757; 438/238, 585, 587, 588, 592, 652, 910, 653, 655, 683, 642, 643, 654, 656, 783, 785, 648, 685

(56) References Cited

U.S. PATENT DOCUMENTS 6,303,483 B1 * 10/2001 Kunikiyo .................. 438/592

2003/0062566 A1 * 4/2003 Schuegraf et al. .......... 257/316

OTHER PUBLICATIONS

Byun, Jeong Soo, "Reduction of Dichlorosilane–Based Tungsten Silicide Resistivity by Amorphization and Its Applicability as an Electrode," Journal of the Electrochemical Society, 146 (6) 2261–2269, 1999.

* cited by examiner

Primary Examiner—Donghee Kang
(74) Attorney, Agent, or Firm—Fletcher Yoder

(57) ABSTRACT

Ion implantation may be used to break up a dielectric layer that forms during the fabrication of a memory array. More specifically, during the fabrication of wordline stacks, a nitride layer may form between the polysilicon layer and the conductive metal layers above the polysilicon layer. While the nitride layer may be desirable during the fabrication process, it may inhibit electrical conductivity between the polysilicon layer and the conductive metal layers. A two step etch process may be implemented wherein the wordline stacks are etched into the polysilicon layer in the first etch and etched down to the substrate during the second etch. An angled implant may be used to break up the nitride layer between the first etch and the second etch.

26 Claims, 4 Drawing Sheets

ANGLED IMPLANT IN A FABRICATION TECHNIQUE TO IMPROVE CONDUCTIVITY OF A BASE MATERIAL

BACKGROUND OF THE INVENTION

1. Field of the Invention

The present invention relates generally to semiconductor fabrication techniques and, more particularly, to a fabrication technique for improving conductivity at an interface between a polysilicon layer and a conductive layer in an integrated circuit device.

2. Description of the Related Art

This section is intended to introduce the reader to various aspects of art that may be related to various aspects of the present invention, which are described and/or claimed below. This discussion is believed to be helpful in providing the reader with background information to facilitate a better understanding of the various aspects of the present invention. Accordingly, it should be understood that these statements are to be read in this light, and not as admissions of prior art.

Semiconductor memory devices, such as dynamic random access memory (DRAM) devices, are widely used for storing data in systems such as computer systems. A DRAM memory cell typically includes an access device such as a field effect transistor (FET) coupled to a storage device such as a capacitor. The access device allows the transfer of charged electons to and from the storage capacitor thereby facilitating read and write operations in the memory device. The memory cells are typically arranged in a number of rows and columns to provide a memory array. Each memory cell in the array is connected to at least one row or "wordline" and at least one column or "bitline." Generally speaking, the gate terminal of the access device may be coupled to the wordline while at least one of the remaining terminals (e.g. drain/source) is coupled to the bitline. The other terminal may be coupled to the capacitor. When a voltage is applied to the wordline, the gate of the access device opens and charged particles flow from the bitline to the storage device or vice versa, depending on the mode of operation of the memory cell (e.g. read or write).

As can be appreciated, a variety of technologies are used to fabricate the memory cells. Generally speaking, layers of conductive, non-conductive, and semiconductive materials are generally disposed on a substrate to form the access and storage structures described above. Numerous fabrication techniques may be used to facilitate the deposition, masking, and etching steps used to construct the memory cells, as can be ascertained by those skilled in the art. In one technique, a conductive material, such as doped polysilicon, is used to form the wordlines which are used to control the gate of the access devices in the memory cell. Each wordline may include several layers disposed on the conductively doped polysilicon layer, thereby forming a wordline stack.

During formation of the wordline stack, a nitride layer, such as silicon nitride ($Si_3N_4$), may be formed on the polysilicon layer to provide an even etch surface. While the nitride layer may be advantageous for part of the fabrication process, it may be the cause of problems in later processing steps. For example, during formation of the wordline stack, a conductive metal material, such as tungsten (W), may be disposed on the polysilicon layer to provide conductive contact to metal layers disposed above the integrated circuit. However, because the thin nitride layer may be used to provide an even etch surface on top of the polysilicon layer, the nitride layer may form a barrier between the conductive metal material and the polysilicon layer. Thus, the nitride layer may ultimately reduce the conductivity between the metal layers and the polysilicon, thereby reducing the effectiveness of the integrated circuits.

BRIEF DESCRIPTION OF THE DRAWINGS

Advantages of the invention may become apparent upon reading the following detailed description and upon reference to the drawings in which.

DETAILED DESCRIPTION OF SPECIFIC EMBODIMENTS

One or more specific embodiments of the present invention will be described below. In an effort to provide a concise description of these embodiments, not all features of an actual implementation are described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

Figure 1:
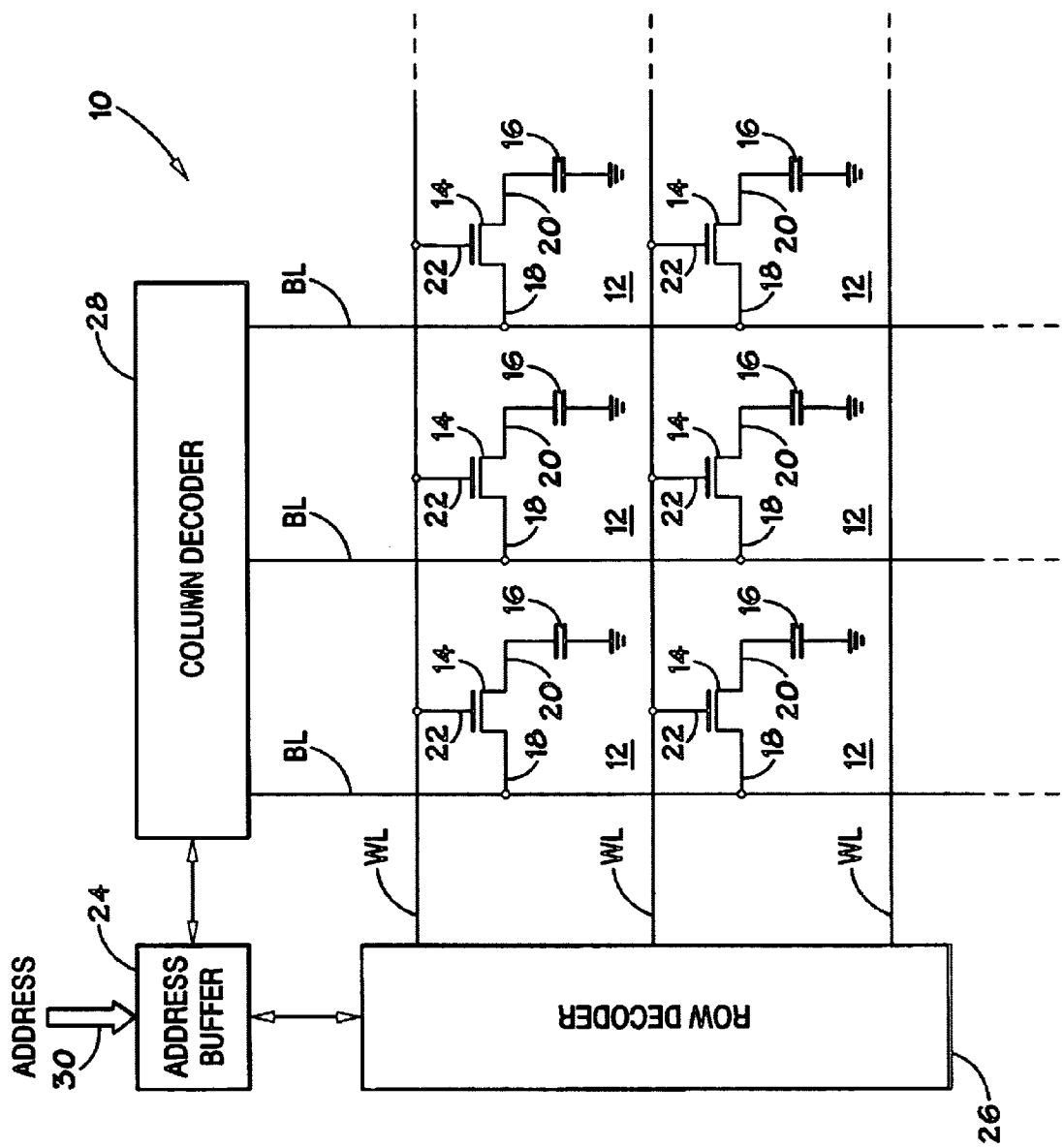
FIG. 1 illustrates a partial electrical schematic of a memory array constructed in accordance with the present techniques.

FIG. 1 is a partial exemplary schematic illustration of an integrated circuit, such as a memory device 10, incorporating an array of memory cells which may be fabricated in accordance with the techniques described herein. The memory device 10 may be, for example, a dynamic random access memory (DRAM) device. In the exemplary embodiment, the memory device 10 includes a number of memory cells 12 arranged in a grid pattern comprising a number of rows and columns. As can be appreciated, the number of memory cells (and corresponding rows and columns) may vary depending on system requirements and fabrication technology.

Each memory cell 12 includes an access device and a storage device as previously discussed. In the present exemplary embodiment, the access device comprises a field-effect transistor (FET) 14 and the storage device comprises a capacitor 16. The access device is implemented to provide controlled access to the storage device. In the exemplary memory cell 12, the FET 14 includes a drain terminal 18 and a source terminal 20, along with a gate terminal 22 for controlling conduction between the drain and source terminals 18, 20. The storage device, such as the capacitor 16, is coupled to one of the source/drain terminals 18, 20. Here, the capacitor 16 is coupled to the source 20. The terminal of the capacitor 16 that is not coupled to the FET 14 may be coupled to a ground plane.

It should be noted that although the above description depicts the terminal of the access device that is coupled to the capacitor 16 as the source 20 and the other non-gate terminal of the access device as the drain 18, during read and write operations, the FET 14 may be operated such that each of the terminals 18 and 20 operates at one time or another as a source or a drain. Accordingly, for purposes of further discussion it should be recognized that whenever a terminal is identified as a source or a drain, it is only for convenience and that in fact during operation of the FET 14 either terminal could be a source or a drain depending on the manner in which the FET 14 is being controlled by the voltages applied to the terminals 18, 20, and 22 of the FET 14.

As previously described, the memory array is arranged in a series of rows and columns. To implement the data storage capabilities in the memory cell 12, an electrical charge is placed on the drain 18 of the FET 14 via a bitline (BL). By controlling the voltage at the gate 22 via the wordline (WL), a voltage potential may be created across the FET 14 such that the electrical charge at the drain 18 can flow to the capacitor 16. As can be appreciated, by storing an electrical charge in the capacitor 16, the charge may be interpreted as a binary data value in the memory cell 12. For instance, for a single-bit storage device, a positive charge above a known threshold voltage may be interpreted as a binary "1." If the charge in the capacitor 16 is below the threshold value, a binary value of "0" is said to be stored in the memory cell 12.

As previously described, the bitlines BL are used to read and write data to and from the memory cells 12. The wordlines WL are used to activate the FET 14 to access a particular row of a memory cell 12. Accordingly, the memory device 10 includes an address buffer 24, row decoder 26, and column decoder 28. As can be appreciated, the address buffer 24 controls each of the row decoder 26 and the column decoder 28. The row decoder 26 and column decoder 28 selectively access the memory cells 12 in response to address signals that are provided on the address bus 30 during read, write, and refresh operations. The address signals are typically provided by an external controller such as a microprocessor or other memory controller. The column decoder 28 may also include sense amplifiers and input/output circuitry to further enable data to be read to and from the memory cell 12 via the bitlines BL.

In one exemplary mode of operation, the memory device 10 receives an address of a particular memory cell 12 at the address buffer 24. The address buffer 24 identifies one of the wordlines WL of the particular memory cell 12 corresponding to the requested address and passes the address to the row decoder 26. The row decoder 26 selectively activates the particular wordline WL to activate the FETs 14 of each memory cell 12 that is connected to the selected wordline WL. The column decoder 28 selects the bitline (or bitlines) BL of the memory cell 12 corresponding to the requested address. For a write operation, data received by input/output circuitry is coupled to the selected bitline (or bitlines) BL and provides for the charge or discharge of the capacitor 16 of the selected memory cell 12 through the FET 14. The charge corresponds to binary data, as previously described. For a read operation, data stored in the selected memory cell 12, represented by the charge stored in the capacitor 16, is coupled to the selected bitline (or bitlines) BL, amplified by the sense amplifier, and a corresponding voltage level is provided to the input/output circuit in the column decoder 28.

As can be appreciated, the memory array described with reference to FIG. 1 of the memory device 10 may be fabricated through a variety of technologies. The presently disclosed techniques may be implemented in the formation of integrated circuits, especially memory devices 10, wherein conductivity through a barrier material may be desirable. More specifically, in forming a wordline stack in a memory device, a barrier layer, such as silicon nitride ($Si_3N_4$), may be disposed or formed on top of a polysilicon layer. As further explained below, a conductive layer, such as tungsten (W), may be disposed on top of the polysilicon layer, but the silicon nitride ($Si_3N_4$) layer may be formed or disposed at some point in the fabrication process such that it is between the conductive layer and the polysilicon layer. It may be desirable to increase the conductivity between the tungsten (W) and the polysilicon layer (i.e. through the silicon nitride ($Si_3N_4$) layer). The present techniques may be used to increase the conductivity through the silicon nitride ($Si_3N_4$) layer.

Wordline stacks are fabricated in memory arrays through a variety of technologies and fabrication techniques. As a matter of convenience, an exemplary embodiment of a wordline stack and fabrication technique is described with reference to FIGS. 2–6. The technique of increasing the conductivity through the wordline stack may be applicable to any number of techniques used to fabricate a memory array, and particularly the wordline stack, including but not limited to vertical transistor technology, trench technology, and planar technology, as can be appreciated by those skilled in the art. Accordingly, the presently described embodiment is not meant to limit the scope and applicability of the novel technique of increasing the conductivity.

Figure 2:
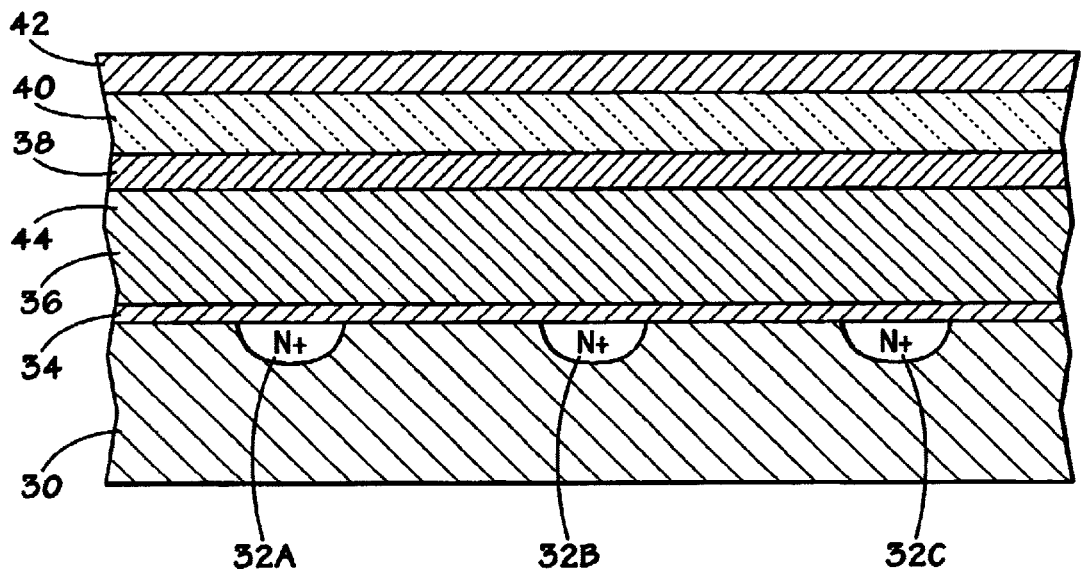
FIGS. 2–6 are a cross-sectional views illustrating a method of fabricating a wordline in accordance with the present techniques.
Figure 3:
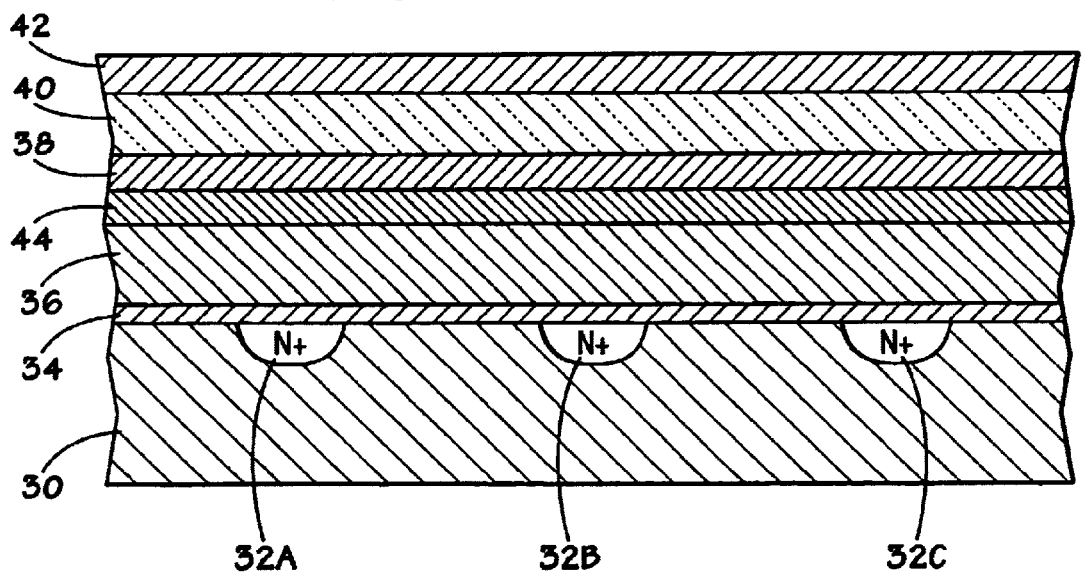

FIG. 2 illustrates a cross-sectional view of a portion of a memory device, such as a DRAM, to illustrate an exemplary method of forming wordline stacks. In one exemplary embodiment, a semiconductor substrate 30, such as a P-channel silicon (Si) substrate, is provided to form the base of the memory device. The substrate 30 may include a number of doped/active regions, here N+ regions 32A, 32B and 32C. Each of the N+ regions 32A, 32B and 32C may be formed by a suitable doping technique such as ion implantation, as can be appreciated by those skilled in the art. Advantageously, the N+ regions 32A, 32B and 32C may be formed using a high-dosage of N+ dopants using low energy implantation. The regions 32A, 32B and 32C will eventually form the source 20 (or drain 18, depending on mode of operation) of the access FET 14. The substrate 30 may include a silicon (Si) wafer, as illustrated in FIG. 2. However, the substrate 30 may also include a wafer having a number of layers disposed thereon such that the processing described hereinafter actually occurs on a wafer having a number of layers already disposed thereon and having a semiconductive layer on top, as can be appreciated by those skilled in the art.

FIG. 2 also includes a gate dielectric layer 34, such as silicon dioxide ($SiO_2$), which has been applied on top of the surface of the substrate 30 by wet or dry oxidation of the semiconductor substrate 30, for instance. For example, the gate dielectric layer 34 may be grown on the surface of the wafer by placing the substrate 30 in a heated chamber and exposing the wafer to oxygen gas, as can be appreciated by those skilled in the art. The oxide layer 30 is generally a thin layer that forms the gate oxide of the FETs 14. It should be understood that the N+ regions 32A, 32B and 32C may actually be formed after deposition of the gate dielectric layer 34.

Typically, each wordline WL further comprises a plurality of layers which form a wordline stack. In the present exemplary embodiment, the wordline stack generally includes a doped semiconductor layer, a conductive layer, and a cap. Here, the doped semiconductor layer comprises a polysilicon layer 36. The polysilicon layer 36 may be disposed onto the oxide layer 32 through chemical vapor deposition (CVD), for example. The conductive layer may comprise one or more metal layers, such as a tungsten (W) layer 40, and a barrier layer, such as a tungsten nitride ($WN_x$) layer 38. The tungsten (W) layer 40 may be disposed by physical vapor deposition (PVD) or chemical vapor deposition (CVD), for example. Other suitable metals may be used in the conductive layer, including, but not limited to copper, gold, tin, aluminum, nickel, titanium, and the like.

During fabrication of the memory array, portions of the polysilicon layer 36 may diffuse into the conductive layer, here tungsten (W) layer 40, thereby degrading the desired conductive properties of the tungsten (W) layer 40. To prevent the diffusion of impurities from the polysilicon layer 36 into the tungsten (W) layer 40, a barrier layer, such as the tungsten nitride ($WN_x$) layer 38, may be disposed between the polysilicon layer 36 and the tungsten (W) layer 40. While the tungsten nitride ($WN_x$) layer 38 electrically connects the tungsten (W) layer 40 to the polysilicon layer 36, it also inhibits the diffusion of impurities from the polysilicon layer 36 into the tungsten (W) layer 40 and protects the tungsten (W) layer 40 during further processing, as can be appreciated by those skilled in the art. The tungsten nitride ($WN_x$) layer 38 may be deposited by physical vapor deposition (PVD) or by chemical vapor deposition (CVD), for example. As with the tungsten layer 40, other suitable materials may be used for the barrier layer, including, but not limited to titanium nitride, for example. Further, the barrier layer may be omitted completely.

The final layer of the wordline stack is a cap, here a nitride layer 42, such as $Si_3N_4$, that is deposited onto the tungsten layer 40. The nitride layer 42 is deposited to protect the underlying materials during further processing. As can be appreciated, the cap may comprise various other common insulating materials such as silicon oxide ($SiO_2$), which may be used instead of the nitride layer 42 or in combination with the nitride layer 42. The nitride layer 42 may be deposited by chemical vapor deposition (CVD), for example.

During the fabrication and deposition steps described above, the substrate 30 may receive one or more heat treatments or "anneals." For instance, after deposition of the nitride layer 42, the substrate 30 may be annealed to increase the conductivity of the tungsten (W) layer 40. A byproduct of the anneal steps that occur during normal fabrication may be the formation of an additional layer, here a silicon nitride ($Si_3N_4$) layer 44 between the polysilicon layer 36 and the tungsten nitride ($WN_x$) layer 38 (or tungsten layer 40, if no barrier layer is applied), as illustrated with respect to FIG. 3. The silicon nitride ($Si_3N_4$) layer 44 forms after deposition of the nitride layer 42, during anneal, as nitrogen gas from the nitride layer 42 deposition diffuses through the tungsten (W) and tungsten nitride ($WN_x$) layers 40 and 38 into the polysilicon layer 36. Further, nitride may denude from the tungsten nitride ($WN_x$) layer 38 into the polysilicon layer 36. Advantageously, the silicon nitride ($Si_3N_4$) layer 44 provides a smooth interface between the polysilicon layer 36 and the layers deposited on the polysilicon layer 36, preventing a rough surface of the polysilicon layer 36 which may occur in the absence of the silicon nitride ($Si_3N_4$) layer 44 as the silicon diffused from the polysilicon layer 36 into the tungsten (W) layer 40. The smooth interface between the polysilicon layer 36 and the layers above may be advantageous during subsequent etching of the wordline stacks. As can be appreciated, if the surface of the polysilicon layer 36 is rough or non-uniform, the time it takes to etch through the surface of the polysilicon layer 36 will disadvantageously vary from area to area. While the silicon nitride ($Si_3N_4$) layer 44 may be desirable during the first step of the etch process to form the wordline stacks, as further described below, the silicon nitride ($Si_3N_4$) layer 44 may be ultimately undesirable since it forms a dielectric between the polysilicon layer 36 and the conductive layer (tunsten layer 40 and tungsten nitride layer 38), thereby reducing conductivity.

Figure 4:
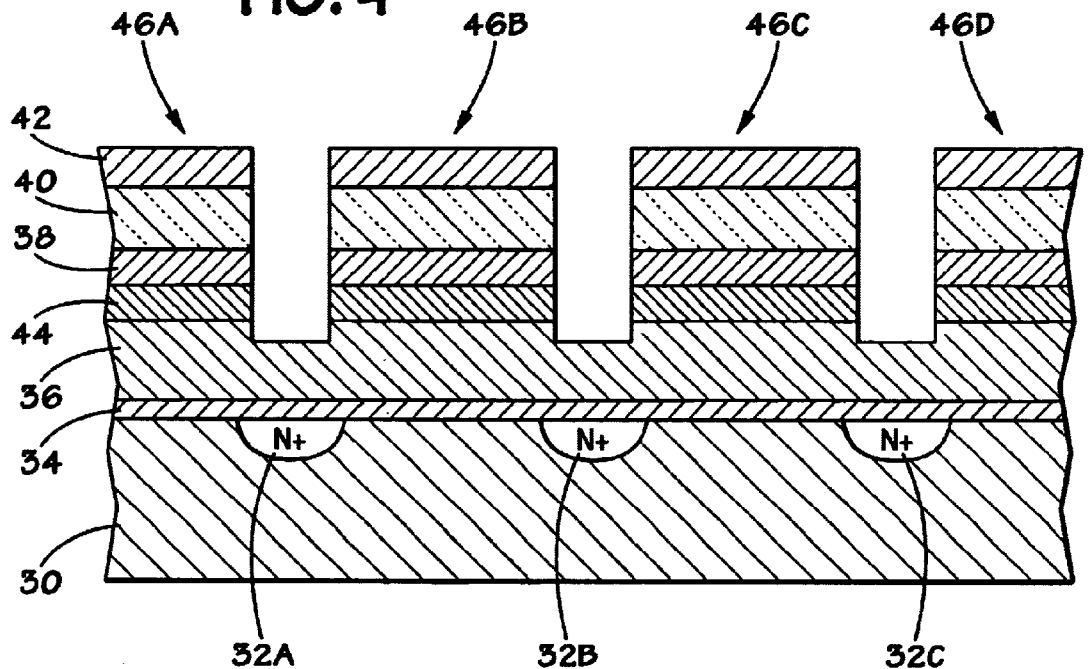

In one fabrication technique, once the materials for the wordline WL have been disposed onto the substrate 30 and the substrate 30 has been annealed, the wordline stacks may be formed using a two-step etch process. FIG. 4 illustrates the structure of FIG. 3, after the first step of the etch process. As can be appreciated by those skilled in the art, one or more photolithographic steps may be used to construct the wordline stacks. A photoresist (not shown) may be disposed onto the surface of the nitride layer 42, patterned, exposed and developed to provide wordline stack areas that are masked by the photoresist. The remaining areas not masked by the photoresist are then etched. The structure is etched through the nitride layer 42, the tungsten (W) layer 40, the tungsten nitride ($WN_x$) layer 38, the silicon nitride ($Si_3N_4$) layer 44 and partially into the polysilicon layer 36. It should be understood that those skilled in the art readily understand the deposition, masking and etching techniques used to construct the structure illustrated in FIG. 4. The structure illustrated in FIG. 4 shows the intermediate structure of four wordline stacks 46A–46D.

As previously discussed, while the silicon nitride ($Si_3N_4$) layer 44 may be desirable to provide uniformly etched wordlines, the silicon nitride ($Si_3N_4$) layer 44 may be ultimately undesirable since it forms a dielectric between the polysilicon layer 36 and the conductive layer (tunsten layer 40 and tungsten nitride layer 38), thereby reducing conductivity from the polysilicon layer 36 to the conductive layers. To reduce the barrier or insulative effects of the silicon nitride ($Si_3N_4$) layer 44, an angled implant may be implemented to break-up the silicon nitride ($Si_3N_4$) layer 44, as illustrated with reference to FIG. 5. By using an angled implant technique, the resistivity through the silicon nitride ($Si_3N_4$) layer can be advantageously reduced.

Figure 5:
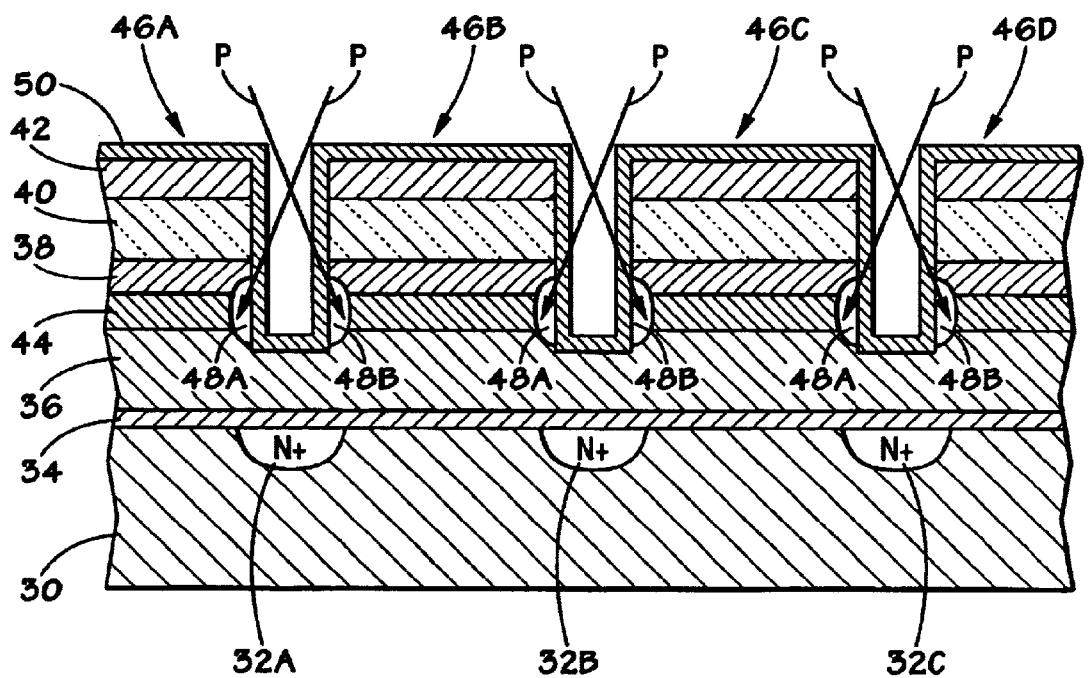

As can be appreciated, ion implantation alters the conductivity of a semiconductor material by introducing defined areas of the semiconductor material to selected impurities (dopants) through high voltage ion bombardment. For silicon based materials, dopants are generally selected from groups III and V on the periodic chart. Accordingly, phosphorous (P) or arsenic (As), for example, may be used in the presently described implantation technique. As illustrated in FIG. 5, phosphorous (P) ions may be directed toward the silicon nitride ($Si_3N_4$) layer 44. The amount of energy used for the ion implantation will depend on the choice of dopant, the thickness of the materials in the wordline stacks 46A–46D, the spacing of the wordline stacks 46A–46D, and the height of the wordline stacks 46A–46D (which will determine the implantation angle), as can be appreciated by those skilled in the art. The energy level used in the ion implantation should be high enough to break up the silicon nitride ($Si_3N_4$) layer 44, but low enough such that it does not effect the underlying gate dielectric layer 34 and substrate 30. By introducing an angled ion implantation fabrication step after the first etch (into the polysilicon layer 36), one or more doped regions 48A and 48B are formed in each wordline stack 46A–46D, thereby "strapping" the edges of the silicon nitride ($Si_3N_4$) layer 44. As can be appreciated, the doped regions 48A and 48B through the silicon nitride ($Si_3N_4$) layer 44 advantageously provide a path of increased conductivity between the tungsten (W) layer 40 (and tungsten nitride ($WN_x$) layer 38) and polysilicon layer 36. Because the tungsten (W) layer 40 will be used to provide the electrical path from the voltage supply to the wordline WL, increased conductivity through the wordline stack 46A–46D down to the polysilicon layer 38 is desirable.

It should be noted that while the doped regions 48A and 48B are illustrated as contact regions of increased conductivity in the silicon nitride ($Si_3N_4$) layer 44, the angled implant simply provides a stream of ions directed towards the silicon nitride ($Si_3N_4$) layer 44. Surrounding layers such as the polysilicon layer 36, the tungsten nitride ($WN_x$) layer 38, the tungsten (W) layer 40, and the nitride layer 42 may also be implanted with the phosphorous (P) ions, thereby strapping the surrounding layers, as well. Further, while two doped regions 48A and 48B are illustrated in FIG. 5, in an alternate embodiment, only one side of each wordline stack 46A–46D may be subjected to the angled implant, thereby reducing the number of processing steps in fabricating the structures.

FIG. 5 also illustrates an optional nitride layer 50 that may be applied before or after the angled implant. The nitride layer 50 may be disposed to protect the walls of the wordline stacks 46A–46D during the final etch process (illustrated in FIG. 6). As can be appreciated, the nitride layer 50 may or may not be implemented in the exemplary two-step etch process described herein.

Figure 6:
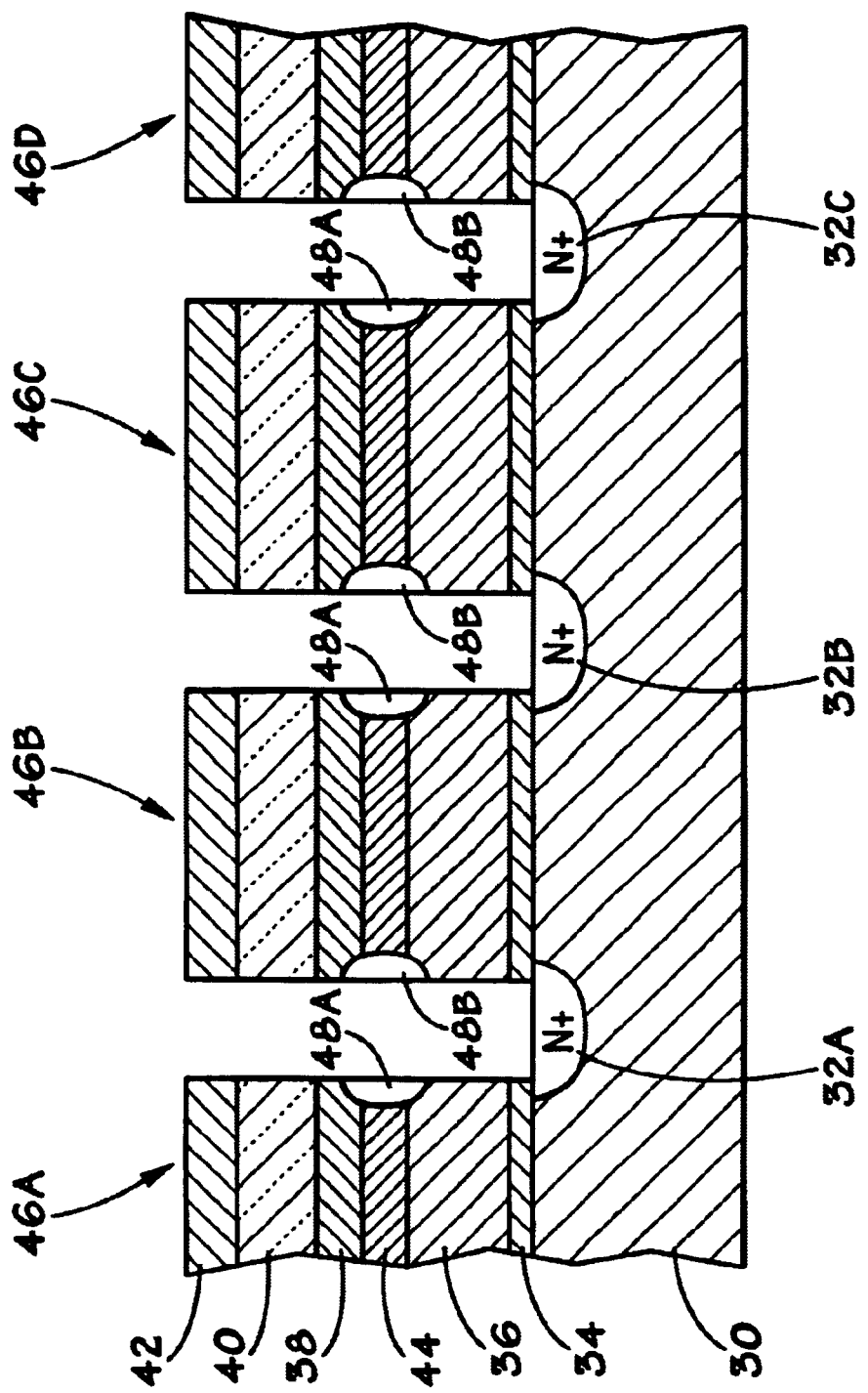

Finally, a second etch is performed to complete each wordline stack 46A–46D, as illustrated in FIG. 6. The second etch isolates each of the wordline stacks 46A–46D with respect to each other by etching down to the substrate 30, thereby enabling the use of the wordlines WL in the memory array, as discussed with respect to FIG. 1, above. It should be understood that those skilled in the art readily understand the deposition, masking, and etching techniques used to implement to the second etch. As can also be appreciated by those skilled in the art, a nitride layer (not shown) may be disposed on the structure illustrated with reference to FIG. 4 or FIG. 5 before the second etch. The nitride layer may comprise $Si_3N_4$, for example, and may be disposed after the first etch to protect the tungsten (W) layer from oxidizing during the additional processing of the substrate 30. The nitride layer may be disposed before or after the angled implant. Subsequently, conventional processing steps are applied to the structure of FIG. 6 to form the storage device, metal interconnect patterns, alloying and finally passivation layers and bond pad pattern etching to complete the memory array, as can be appreciated by those skilled in the art.

While the invention may be susceptible to various modifications and alternative forms, specific embodiments have been shown by way of example in the drawings and have been described in detail herein. However, it should be understood that the invention is not intended to be limited to the particular forms disclosed. Rather, the invention is to cover all modifications, equivalents, and alternatives falling within the spirit and scope of the invention as defined by the following appended claims.

What is claimed is:

1. A method of fabricating a structure having a semiconductor layer formed over a substrate, a dielectric layer formed over the semiconductor layer and a conductor layer formed over the dielectric layer, comprising the acts of:
   etching the structure entirely through the conductor layer and the dielectric layer and partially through the semiconductor layer;
   doping the dielectric layer to create one or more active regions in the dielectric layer; and
   etching the remainder of the semiconductor layer to the substrate.

2. The method of fabricating a structure, as set forth in claim 1, wherein the act of etching the structure partially through the semiconductor layer comprises the act of etching the structure partially through a polysilicon layer.

3. The method of fabricating a structure, as set forth in claim 1, wherein the act of doping comprises the act of doping a nitride layer.

4. The method of fabricating a structure, as set forth in claim 3, wherein the act of doping comprises the act of doping a silicon nitride layer.

5. The method of fabricating a structure, as set forth in claim 1, wherein the act of doping comprises the act of doping by angled ion implantation.

6. The method of fabricating a structure, as set forth in claim 5, wherein the act of doping comprises the act of using a phosphorous implant to perform the angled ion implantation.

7. The method of fabricating a structure, as set forth in claim 1, comprising the act of depositing a nitride layer over the structure after the act of etching partially through the semiconductor layer.

8. The method of fabricating a structure, as set forth in claim 1, comprising the act of depositing a nitride layer over the structure after the act of doping.

9. The method of fabricating a structure, as set forth in claim 1, wherein the method comprises the method of fabricating a wordline stack.

10. The method of fabricating a structure, as set forth in claim 1, wherein the acts are performed in the recited order.

11. A method of fabricating an integrated circuit comprising the acts of:
    disposing a semiconductor layer over a substrate;
    disposing a conductor layer over the semiconductor layer;
    disposing a nitride layer over the conductor layer;
    forming a dielectric layer between the conductor layer and the semiconductor layer;
    etching through each of the nitride layer, the conductor layer, and the dielectric layer;
    etching partially through the semiconductor layer; and
    doping the dielectric layer to increase the electrical conductivity through the dielectric layer.

12. The method of fabricating an integrated circuit, as set forth in claim 11, wherein the act of disposing a semiconductor layer comprises the act of disposing a polysilicon layer on the substrate.

13. The method of fabricating an integrated circuit, as set forth in claim 11, wherein the act of disposing a conductive layer comprises that act of disposing a metal layer.

14. The method of fabricating an integrated circuit, as set forth in claim 13, wherein the act of disposing a metal layer comprises that act of disposing a tungsten layer.

15. The method of fabricating an integrated circuit, as set forth in claim 11, wherein the act of disposing a conductive layer comprises that acts of:
    disposing a barrier layer on the semiconductor layer; and
    disposing a metal layer on the barrier layer.

16. The method of fabricating an integrated circuit, as set forth in claim 15, wherein the act of disposing a barrier layer comprises that act of disposing a tungsten nitride layer.

17. The method of fabricating an integrated circuit, as set forth in claim 15, wherein the act of disposing a metal layer comprises that act of disposing a tungsten layer.

18. The method of fabricating an integrated circuit, as set forth in claim 11, wherein the act of forming a dielectric layer comprises the act of annealing the integrated circuit.

19. The method of fabricating an integrated circuit, as set forth in claim 11, wherein the act of forming a dielectric layer comprises the act of forming a silicon nitride layer.

20. The method of fabricating an integrated circuit, as set forth in claim 11, wherein the act of doping comprises the act of implanting ions into the dielectric layer.

21. The method of fabricating an integrated circuit, as set forth in claim 11, wherein the act of doping comprises the act of implanting ions into the dielectric layer through angled implantation.

22. The method of fabricating an integrated circuit, as set forth in claim 20, wherein the act of doping comprises the act of implanting ions into the dielectric layer using phosphorous implants.

23. The method of fabricating an integrated circuit, as set forth in claim 11, comprising the act of etching through the remainder of the semiconductor layer to the substrate.

24. The method of fabricating an integrated circuit, as set forth in claim 23, comprising the act of after the act of etching through the remainder of the semiconductor layer, disposing a nitride layer on the substrate.

25. The method of fabricating an integrated circuit, as set forth in claim 11, comprising the act of after the act of etching partially through the semiconductor layer, disposing a nitride layer on the substrate.

26. The method of fabricating an integrated circuit, as set forth in claim 11, wherein the acts are performed in the recited order.

* * * * *